United States Patent
Stolze et al.

(10) Patent No.: US 7,450,389 B2
(45) Date of Patent: Nov. 11, 2008

(54) SUB-ASSEMBLY

(75) Inventors: Thilo Stolze, Arnsberg (DE); Richard Boettcher, Warstein (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 11/682,483

(22) Filed: Mar. 6, 2007

(65) Prior Publication Data
US 2007/0202721 A1    Aug. 30, 2007

Related U.S. Application Data

(63) Continuation of application No. PCT/EP2005/007514, filed on Jul. 12, 2005.

(30) Foreign Application Priority Data
Sep. 6, 2004    (DE)    ........................ 10 2004 043 019

(51) Int. Cl.
*H05K 7/20* (2006.01)
*H01L 23/34* (2006.01)

(52) U.S. Cl. ........................ 361/715; 361/704; 361/717; 165/185; 257/712; 257/719

(58) Field of Classification Search ................. 361/704, 361/707, 709–710, 714–715, 717–718, 719, 361/760, 772–773, 776; 165/104.33, 185; 257/688, 696, 706–707, 712–713, 718–719; 174/16.3
See application file for complete search history.

(56) References Cited

U.S. PATENT DOCUMENTS

| | | | | |
|---|---|---|---|---|
| 4,009,485 A * | 2/1977 | Koenig | ........................ | 257/692 |
| 5,386,338 A | 1/1995 | Jordan et al. | ................. | 361/704 |
| 5,428,897 A | 7/1995 | Jordan et al. | .............. | 29/890.03 |
| 6,542,365 B2 * | 4/2003 | Inoue | ........................ | 361/699 |
| 6,759,278 B2 * | 7/2004 | Ashdown | ..................... | 438/122 |
| 6,812,562 B2 * | 11/2004 | Ashdown | ..................... | 257/713 |
| 7,034,395 B2 | 4/2006 | Stolze | ........................ | 257/718 |
| 7,106,592 B2 * | 9/2006 | Inoue et al. | ................. | 361/704 |
| 2002/0109220 A1 * | 8/2002 | Ashdown | ..................... | 257/713 |

FOREIGN PATENT DOCUMENTS

| | | | |
|---|---|---|---|
| DE | 3505085 A | * | 8/1986 |
| DE | 44 45 541 A1 | | 6/1995 |
| DE | 297 20 480 U1 | | 4/1999 |

(Continued)

OTHER PUBLICATIONS

German Office Action for German Patent Application No. 10 2004 043 019.5 (3 pages), Mar. 20, 2005.

(Continued)

*Primary Examiner*—Jayprakash N Gandhi
*Assistant Examiner*—Robert J Hoffberg
(74) *Attorney, Agent, or Firm*—Coats & Bennett, P.L.L.C.

(57) ABSTRACT

A power semiconductor module has a heat-dissipation contact surface (16) for a thermally conductive connection to a cooling element (17). The module can be simply, cost-effectively and reliably fixed to the cooling element for the conduction of heat to the latter by at least one pressure element (18, 19) which is permanently connected to the power semiconductor module. When mounted, the pressure element (18) presses the heat-dissipation contact surface (16) against the cooling element (17).

8 Claims, 1 Drawing Sheet

FOREIGN PATENT DOCUMENTS

| | | |
|---|---|---|
| DE | 200 14 739 U1 | 1/2001 |
| DE | 199 42 915 A1 | 3/2001 |
| DE | 101 42 971 A1 | 3/2003 |
| DE | 101 49 886 A1 | 4/2003 |
| EP | 0 295 387 A2 | 12/1988 |
| EP | 0 434 298 A1 | 6/1991 |
| JP | 63226048 | 9/1988 |
| WO | 93/16580 A1 | 8/1993 |

OTHER PUBLICATIONS

International Search Report and Written Opinion for International Application No. PCT/EP2005/007514 (12 pages), Nov. 28, 2005.

International Preliminary Report on Patentability for International Application No. PCT/EP2005/007514 (7 pages), Mar. 29, 2007.

Eschrich, Fred; "IGBT Modules Simplify Inverter Design," Jul./Aug. 1996, pp. 284-286.

\* cited by examiner

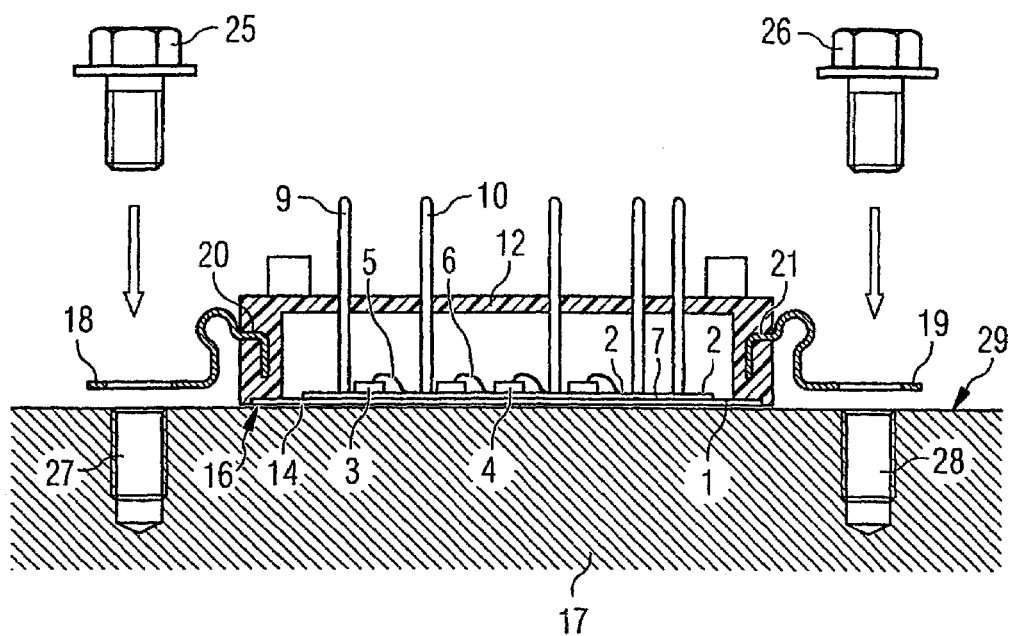
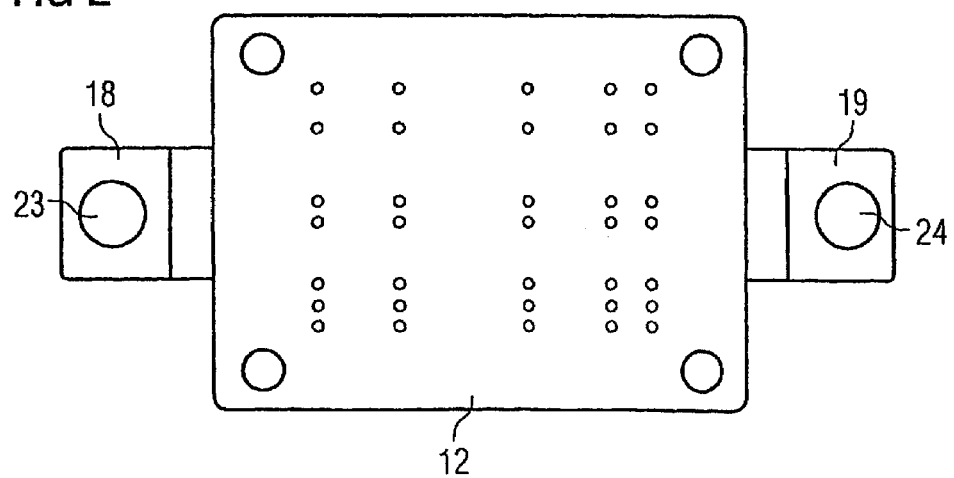

SUB-ASSEMBLY

CROSS-REFERENCE TO RELATED APPLICATION

This application is a continuation of co-pending International Application No. PCT/EP2005/007514 filed Jul. 12, 2005 which designates the United States, and claims priority to German application number DE 10 2004 043 019.5 filed Sep. 6, 2004.

TECHNICAL FIELD

The invention relates to a power semiconductor module comprising a heat-dissipation contact area for thermally conductive connection to a cooling element.

BACKGROUND

A module construction of this type is customary and known e.g. from DE 199 42 915 A1. Said known module comprises an insulating and thermally conductive carrier (substrate) composed e.g. of a ceramic material coated e.g. with copper (DCB) on both sides. Conductor track structures are formed in the top side coating, a plurality of power semiconductors being electrically connected to said structures. The substrate underside functions as a heat-dissipation contact area in order to be able to dissipate power losses occurring in the form of heat during operation to a heat sink. For this purpose, a press-on device engaging over a plurality of substrates is provided, having pressure pieces which both serve for electrical contact-connection and press the substrates onto the heat sink.

DE 297 20 480 U1 and DE 200 14 739 U1 show press-on elements in the form of a clip which is connected by at least one fixing region to the cooling element in a positively locking manner (DE 297 20 480 U1) or by screw connection (DE 200 14 739 U1). A press-on region of the clip presses the component to be cooled onto the cooling element by its heat-dissipation contact area.

The mounting of the known power semiconductor module on the cooling element is complicated and cost-intensive because the press-on element/elements has/have to be handled, supplied and mounted separately in the mounting process. Depending on the configuration of the power semiconductor module and the press-on element, mounting errors may occur in this case—e.g. as a result of defective positioning or orientation—and said mounting errors influence the cooling effect and hence the operational reliability. Moreover, the connection between power semiconductor module and press-on element involves dimensional tolerances which have an unforeseeable effect on the magnitude of the press-on forces exerted.

SUMMARY

A power semiconductor module may comprise a heat-dissipation contact area for thermally conductive connection to a cooling element, and at least one press-on element which is captively connected to the power semiconductor module, and which presses the heat-dissipation contact area onto the cooling element in the mounted state.

BRIEF DESCRIPTION OF THE DRAWINGS

The invention is explained in more detail below by way of example with reference to a drawing, in which:

FIG. 1 schematically shows a power semiconductor module according to an embodiment in longitudinal section, and FIG. 2 shows the module in plan view.

DETAILED DESCRIPTION

According to an embodiment, at least one press-on element which is captively connected to the power semiconductor module can be provided. The press-on element presses the heat-dissipation contact area onto the cooling element in the mounted state, thereby ensuring the desired reliable thermally conductive contact between power semiconductor module and cooling element.

According to an embodiment, the press-on element, upon connection of a module to a cooling element, does not have to be separately delivered, stored, handled, supplied and finally mounted at the power semiconductor module. Since the press-on element is configured as an integral element, according to an embodiment, that is captively connected to the power semiconductor module, it advantageously forms an (in this respect prefabricated) sub-assembly for simple and cost-effective mounting on and connection to the cooling element. Since, according to an embodiment, the connection between power semiconductor module and press-on element is prefabricated (in an automated manner), significantly smaller tolerances can also be complied with, thereby reducing the power semiconductor module/press-on element/cooling element tolerance chain that determines the press-on forces.

A further advantage, according to an embodiment, consists in the fact that suitably dimensioned press-on elements can be fixedly assigned and predetermined by the manufacturer. During mounting, therefore, the user is not faced with the task of having to dimension or assign suitable press-on elements. Various power semiconductor modules (e.g. with different powers), according to different embodiments, can thus be provided with uniform press-on elements, which further simplifies stockeeping and logistics.

According to an embodiment, the press-on element may be a resilient clamp, which can advantageously be produced in a particularly simple manner.

According to an embodiment, which may be preferred from a constructive and production engineering standpoint, the press-on element can be anchored with an anchoring region in the power semiconductor module. The anchoring region can be particularly preferably injection-molded into the material of an injection-molding housing of the power semiconductor module.

FIG. 1 shows a power semiconductor module comprising a substrate 1, which is embodied as a ceramic lamina coated with copper (DCB) on both sides. On the top side 2, in a manner known per se, a plurality of power semiconductors 3, 4 are arranged and connected by base-side soldering and/or bonding wires 5, 6 to conductor tracks 7 formed on the top side. In addition, electrical connection contacts, e.g. 9, 10, extend upward. The substrate 1 and the power semiconductor arrangement are covered by a plastic housing 12 produced by injection molding. The underside 14 of the substrate simultaneously forms the lower outer area and serves by virtue of its copper coating—formed over the whole area—as heat-dissipation contact area 16 for thermally conductive connection to a cooling element 17.

Press-on elements 18, 19 shaped in clamp-type fashion with a respective anchoring region 20, 21 are in each case injection-molded into the housing 12 on both sides. The housing material (plastic) thus surrounds the anchoring regions and provides for a fixed, captive seating of the press-on elements. The press-on elements thus already become integral constituent parts of the power semiconductor module in a very early manufacturing stage—preferably during the production of the housing 12. For this purpose, the press-on elements can be inserted as insert parts into the plastic injection-molding mold for the housing and be integrated in a single injection-molding operation—which is required anyway for producing the housing.

FIG. 2 shows the arrangement and configuration of the press-on elements 18, 19 in plan view for illustration. A symmetrical arrangement of the press-on elements is chosen here; this is not mandatory, however. Asymmetrical configurations or else—depending on the press-on force desired—only one press-on element or more than two press-on elements are likewise conceivable. The press-on elements have holes 23, 24 through which fixing screws 25, 26 (FIG. 1) can reach for the releasable mounting of the module on the cooling element.

As indicated by arrows (FIG. 1), the press-on elements are pressed onto the top side 29 of the cooling element by the screws 24, 25 reaching into threaded holes 27, 28. In this case, the press-on elements generate the desired homogeneous press-on forces on account of their spring-elastic properties.

The power semiconductor module according to the different embodiments therefore combines the advantages of the press-on properties that can be generated by press-on elements or resilient clamps with a simple and cost-effective realization of the connection to the cooling element.

LIST OF REFERENCE SYMBOLS

1 Substrate
2 Top side
3 Power semiconductor
4 Power semiconductor
5 Bonding wire
6 Bonding wire
7 conductor track
9 connection contact
10 connection contact
12 Plastic housing
14 Underside
16 Heat-dissipation contact area
17 Cooling element
18 Press-on element
19 Press-on element
20 Anchoring region
21 Anchoring region
23 Hole
24 Hole
25 Fixing screw
26 Fixing screw
27 Threaded hole
28 Threaded hole
29 Top side of cooling element

What is claimed is:

1. A power semiconductor module, comprising:
   one or more power semiconductor devices arranged on a top-side of a substrate;
   a heat-dissipation contact area arranged on a bottom-side of the substrate;
   at least one electrically isolated mechanical spring fastener extending outward from the power semiconductor module, the at least one mechanical spring fastener having a mounted position different from an un-mounted position; and
   wherein the at least one mechanical spring fastener is operable to press the heat-dissipation contact area into contact with a heat sink via a spring force stored by the at least one mechanical spring fastener when the at least one mechanical spring fastener is attached to the heat sink in the mounted position.

2. The power semiconductor module according to claim 1, wherein the at least one mechanical spring fastener comprises a resilient clamp.

3. The power semiconductor module according to claim 1, wherein the at least one mechanical spring fastener is anchored with an anchoring region in the power semiconductor module.

4. The power semiconductor module according to claim 3, wherein
   the power semiconductor module has an injection-molded housing, and
   the anchoring region of the at least one mechanical spring fastener is molded into the housing.

5. An assembly comprising:
   a heat sink;
   a power semiconductor module having a heat-dissipation contact area;
   at least one electrically isolated mechanical spring fastener extending outward from the power semiconductor module, the at least one mechanical spring fastener having a mounted position different from an un-mounted position; and
   wherein the at least one mechanical spring fastener is attached to the heat sink in the mounted position and presses the heat-dissipation contact area into contact with the heat sink via a spring force stored by the at least one mechanical spring fastener in the mounted position.

6. The assembly according to claim 5, wherein the at least one mechanical spring fastener comprises a resilient clamp.

7. The assembly according to claim 5, wherein the at least one mechanical spring fastener is anchored with an anchoring region in the power semiconductor module.

8. The assembly according to claim 7, wherein the power semiconductor module has an injection-molded housing, and the anchoring region of the at least one mechanical spring fastener is molded into the housing.

* * * * *

UNITED STATES PATENT AND TRADEMARK OFFICE
CERTIFICATE OF CORRECTION

PATENT NO.        : 7,450,389 B2                                              Page 1 of 1
APPLICATION NO.   : 11/682483
DATED             : November 11, 2008
INVENTOR(S)       : Stolze et al.

It is certified that error appears in the above-identified patent and that said Letters Patent is hereby corrected as shown below:

In the specification section, under Detailed Description at column 2, line 12, in the printed patent, please change "between power" to -- between the power --

Signed and Sealed this

Tenth Day of March, 2009

JOHN DOLL
*Acting Director of the United States Patent and Trademark Office*